United States Patent
Kondo

(10) Patent No.: US 9,389,250 B2
(45) Date of Patent: Jul. 12, 2016

(54) LOAD TESTING APPARATUS

(71) Applicant: Tatsumi Ryoki Co., Ltd, Tokyo (JP)

(72) Inventor: Toyoshi Kondo, Tokyo (JP)

(73) Assignee: Tatsumi Ryoki Co., Ltd, Tokyo (JP)

( * ) Notice: Subject to any disclaimer, the term of this patent is extended or adjusted under 35 U.S.C. 154(b) by 0 days.

(21) Appl. No.: 14/667,522

(22) Filed: Mar. 24, 2015

(65) Prior Publication Data

US 2015/0198636 A1    Jul. 16, 2015

Related U.S. Application Data

(63) Continuation of application No. PCT/JP2014/005601, filed on Nov. 7, 2014, which is a continuation of application No. PCT/JP2013/006809, filed on Nov. 20, 2013.

(51) Int. Cl.
| | |
|---|---|
| *G01R 19/165* | (2006.01) |
| *G01R 31/42* | (2006.01) |
| *G01R 31/34* | (2006.01) |
| *G01R 19/15* | (2006.01) |

(Continued)

(52) U.S. Cl.
CPC .............. *G01R 19/165* (2013.01); *G01R 19/15* (2013.01); *G01R 19/155* (2013.01); *G01R 31/343* (2013.01); *G01R 31/42* (2013.01); *G01R 1/203* (2013.01)

(58) Field of Classification Search
CPC ...... G01R 31/343; G01R 31/40; G01R 31/42; G01R 1/203
See application file for complete search history.

(56) References Cited

U.S. PATENT DOCUMENTS

| | | | |
|---|---|---|---|
| 5,488,334 A | 1/1996 | Wolk | |
| 6,653,928 B1 * | 11/2003 | Kondo | ................. G01R 1/203 338/215 |
| 2006/0121421 A1 * | 6/2006 | Spitaels | ................. G06F 1/206 434/118 |

(Continued)

FOREIGN PATENT DOCUMENTS

| | | | |
|---|---|---|---|
| CN | 1296169 A | 5/2001 | |
| CN | 101587137 A | 11/2009 | |

(Continued)

OTHER PUBLICATIONS

International Search Report issued in PCT/JP2014/005601, mailed on Feb. 10, 2015, with translation (6 pages).

(Continued)

*Primary Examiner* — Jermele M Hollington
*Assistant Examiner* — Dustin Dickinson
(74) *Attorney, Agent, or Firm* — Nakanishi IP Associates, LLC

(57) ABSTRACT

A load testing apparatus includes a resistive unit that includes one or more resistor groups having a plurality of resistors and is connected with a power source to be tested for a load test. A cooling fan cools the resistors in the resistive unit. The resistive unit includes a current/voltage detection part that detects a current flowing through or a voltage applied to the resistors, the resistor groups, or the resistive unit and a temperature detection part that detects an exhaust temperature at a downstream of the resistive unit. A rotation state detection part detects a rotation state of the cooling fan. A control unit performs off control that stops power supply from the power source to be tested to the resistive unit based on information from the current/voltage detection part, information from the temperature detection part, and information from the rotation state detection part.

5 Claims, 9 Drawing Sheets

(51) Int. Cl.
  *G01R 19/155* (2006.01)
  *G01R 1/20* (2006.01)

(56) References Cited

U.S. PATENT DOCUMENTS

| | | | | |
|---|---|---|---|---|
| 2011/0169521 A1* | 7/2011 | Xie | ............... | G01R 31/40 324/764.01 |
| 2012/0105098 A1* | 5/2012 | Hancock | ............... | G01R 31/42 324/765.01 |
| 2013/0088894 A1* | 4/2013 | Rozman | ............... | G01R 31/40 363/15 |
| 2013/0103879 A1* | 4/2013 | Wei | ............... | G06F 11/2733 710/316 |
| 2013/0308240 A1* | 11/2013 | Yu | ............... | G01R 31/40 361/103 |

FOREIGN PATENT DOCUMENTS

| | | |
|---|---|---|
| CN | 201828578 U | 5/2011 |
| CN | 202975291 U | 1/2016 |
| CN | 202563073 U | 2/2016 |
| JP | 2000-19231 A | 1/2000 |
| JP | 2006-238681 A | 9/2006 |
| JP | 5551324 B1 | 7/2014 |

OTHER PUBLICATIONS

Written Opinion of the International Searching Authority issued in PCT/JP2014/005601, mailed on Feb. 10, 2015, with translation (6 pages).

Office Action issued in Chinese Patent Application No. 201480005706.5 mailed on Feb. 25, 2016 with translation (14 pages).

Search Report issued in Chinese Patent Application No. 201480005706.5 mailed on Jan. 27, 2016 with translation (4 pages).

* cited by examiner

LOAD TESTING APPARATUS

CROSS-REFERENCE TO RELATED APPLICATIONS

This application is a continuation application of International Patent Application No. PCT/JP2014/005601 filed on Nov. 7, 2014, which claims priority to International Patent Application No. PCT/JP2013/006809 filed on Nov. 20, 2013, the entire contents of which are incorporated by reference in its entirety herein.

TECHNICAL FIELD

The present invention relates to a load testing apparatus.

BACKGROUND ART

Conventionally, as in Patent Literature 1, an apparatus that stops energization to a resistor in a case where a current flowing through the resistor or the like is abnormal in a load test has been proposed.

CITATION LIST

Patent Literature

Patent Literature 1: JP 2000-019231 A

SUMMARY OF INVENTION

Technical Problem

However, abnormality detection of the load testing apparatus including various units, such as a cooling fan, cannot be appropriately performed only by detecting the current flowing through the resistor or the like.

Therefore, an object of the present invention is to provide a load testing apparatus capable of appropriately performing abnormality detection therein.

Solution to Problem

A load testing apparatus according to the present invention includes: a resistive unit that includes one or more resistor groups having a plurality of resistors and is connected with a power source to be tested for a load test; a cooling fan that cools the resistors in the resistive unit; and a control unit, wherein the resistive unit is provided with a current/voltage detection part that detects a current flowing through or a voltage applied to the resistors, the resistor groups, or the resistive unit and a temperature detection part that detects an exhaust temperature at a downstream of the resistive unit, a rotation state detection part that detects a rotation state of the cooling fan is provided in the cooling fan, and the control unit performs off control that stops power supply from the power source to be tested to the resistive unit based on information from the current/voltage detection part, information from the temperature detection part, and information from the rotation state detection part.

The control unit performs the off control after detecting the operating condition of the cooling fan by the rotation state detection part, the condition of the current or the voltage by the current/voltage detection part, and the exhaust temperature by the temperature detection part. Accordingly, in a case where a malfunction has occurred in the load testing apparatus, the control unit stops the power supply from the power source to be tested to the load testing apparatus (the resistive unit). As a result, abnormality detection inside the load testing apparatus is appropriately performed, and a further failure of the load testing apparatus (particularly, the resistive unit) can be prevented.

Preferably, the load testing apparatus further includes: a current/voltage warning part indicating by at least one of light and sound that the off control is based on the information from the current/voltage detection part; a temperature warning part indicating by at least one of light and sound that the off control is based on the information from the temperature detection part; and a cooling fan warning part indicating by at least one of light and sound that the off control is based on the information from the rotation state detection part.

Particularly, by performing the warning to indicate the malfunctioning place, it is possible to grasp whether it is an operation failure of the cooling fan, a malfunction of the resistive unit, the other malfunction (or an overall malfunction), or the like, and the malfunction can be easily improved.

Still preferably, the resistive unit has the two or more resistor groups, the resistor group includes two or more selection switches that are used for selecting whether or not the power from the power source to be tested is supplied, the current/voltage detection part is provided for every resistor group, and as the current/voltage warning part, a lighting device is provided in a vicinity of each of the two or more selection switches.

Particularly, by performing the warning to indicate the malfunctioning place, it is possible to visually recognize whether it is an operation failure of the cooling fan, a malfunction of the resistive unit (and which resistor group has the malfunction), the other malfunction (or an overall malfunction), or the like, and the malfunction can be easily improved.

Still preferably, for the resistor group which has been selected as a power supply object from the power source to be tested via the selection switch, a determination is made as to whether or not a value of a current flowing through the resistor group or a value of a voltage applied to the resistor group is within a range during normal operation, and for the resistor group which has not been selected as the power supply object from the power source to be tested, a determination is made as to whether or not the current flows through the resistor group or whether or not the voltage is applied to the resistor group.

Further preferably, an exhaust lid that opens when being used is provided at an exhaust port at the downstream of the resistive unit, an exhaust opening detection part that detects an opened/closed state of the exhaust lid is provided at the exhaust port or the exhaust lid, and the control unit performs the off control based on the information from the current/voltage detection part, the information from the temperature detection part, the information from the rotation state detection part, and information from the exhaust opening detection part.

Still preferably, an intake lid that opens when being used is provided at an intake port of the cooling fan, an intake opening detection part that detects an opened/closed state of the intake lid is provided at the intake port or the intake lid, the control unit performs the off control based on the information from the current/voltage detection part, the information from the temperature detection part, the information from the rotation state detection part, the information from the exhaust opening detection part, and information from the intake opening detection part.

Further preferably, an opening operation of the exhaust lid is performed by driving an actuator, the off control is started after a time needed to open the exhaust lid by the actuator has passed since a main power source of the load testing apparatus is turned on.

A load testing apparatus according to the present invention includes: a resistive unit that includes one or more resistor groups having a plurality of resistors and is connected with a power source to be tested for a load test; a cooling fan that cools the resistors in the resistive unit; and a control unit, wherein an exhaust lid that opens when being used is provided at an exhaust port at a downstream of the resistive unit, an exhaust opening detection part that detects an opened/closed state of the exhaust lid is provided at the exhaust port or the exhaust lid, and the control unit performs off control that stops power supply from the power source to be tested to the resistive unit based on information from the exhaust opening detection part and at least one of information about a current flowing through or a voltage applied to the resistors, the resistor groups, or the resistive unit, information about an exhaust temperature at the downstream of the resistive unit, and information about a rotation state of the cooling fan.

Preferably, the load testing apparatus further includes a protective relay that performs the off control based on information about a current flowing through a power source line from a power source for driving that supplies power driving the cooling fan or a voltage applied from the power source for driving to the load testing apparatus via the power source line.

Abnormality detection of a power supply source (an auxiliary power source or a cable) is performed based on a power supply state from the auxiliary power source serving as a source of driving the respective units of the load testing apparatus. In a case where the power supply from the auxiliary power source is performed normally, the power supply from the power source to be tested is enabled. Accordingly, it is possible to perform the abnormality detection or the load test of the load testing apparatus correctly.

Advantageous Effects of Invention

As described above, according to the present invention, the load testing apparatus capable of appropriately performing the abnormality detection therein can be provided.

DESCRIPTION OF EMBODIMENTS

Figure 1:
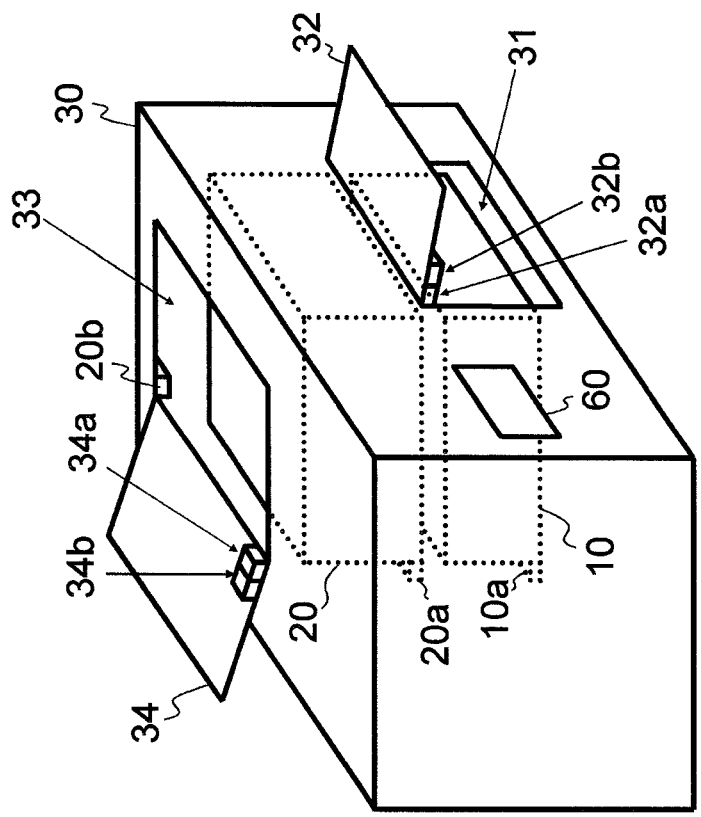
FIG. 1 is a perspective view that illustrates a configuration of a load testing apparatus in a present embodiment.
Figure 2:
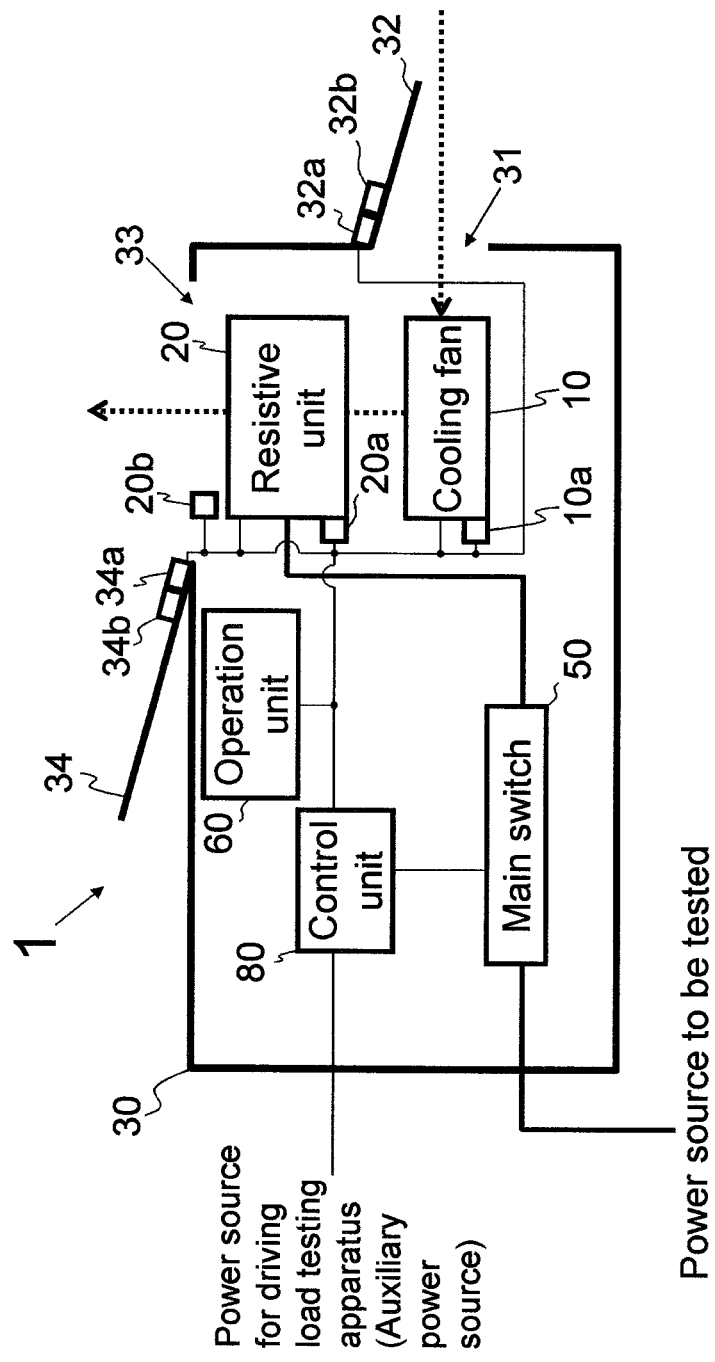
FIG. 2 is an exemplary diagram that illustrates a configuration of the load testing apparatus.

The present embodiment will be described below by using the drawings. A load testing apparatus 1 in a first embodiment includes a cooling fan 10, a resistive unit 20, a housing 30, a main switch 50, an operation unit 60, and a control unit 80, and is used for performing a load test of a power source device (power source to be tested), such as a generator (see FIGS. 1 to 6).

The cooling fan 10 is a device that feeds cooling air to the resistive unit 20, and the resistive unit 20 is disposed above the cooling fan 10.

A rotation state detection part 10a, such as a fiber sensor, a laser sensor, a photoelectric sensor, or a wind pressure sensor, that detects a rotation state of a fan is provided in the cooling fan 10.

The rotation state detection part 10a detects a rotation number of the cooling fan 10 and transmits information about the rotation number to the control unit 80.

The resistive unit 20 is a unit provided with one or more resistor groups where a plurality of bar-shaped resistors extending in a horizontal direction is aligned with a predetermined interval therebetween and is connected in series or in parallel. During the load test, power from the power source to be tested is supplied to a portion or the whole of the resistor groups.

The resistor is not limited to a resistor constituted by an electrical heating wire and may be a resistor, such as a battery, that is capable of accumulating power inside.

The resistive unit 20 is provided with a current/voltage detection part 20a that detects a current flowing through the resistor or a voltage applied to the resistor by connecting with a bus bar or an electric cable connected to the resistor, such as an ammeter or a voltmeter, and a temperature detection part 20b that detects an exhaust temperature of an upper portion of the resistive unit 20.

The current/voltage detection part 20a detects the current flowing through the resistor or the voltage applied to the resistor and transmits information about the current or the voltage to the control unit 80. It is desirable that the current/voltage detection part 20a be in a form of being disposed at every resistor group. However, it is possible to be in a form where the only one current/voltage detection part 20a is disposed at a portion of a previous stage where the power supplied from the power source to be tested via the main switch 50 is distributed to each resistor group. Further, it is possible to be in a form where the current/voltage detection part 20a is disposed at each and every resistor configuring the resistor group.

The present embodiment gives an example where the current/voltage detection part 20a is disposed at every resistor group. Since switches (a first switch S1 to a fourth switch S4) of a selection switch 60b are provided only by the number of the resistor groups (four in the present embodiment), there is a merit that the resistor group having a malfunctioning place is easily indicated.

Further, in a case where the power source to be tested is a three-phase AC power source, it is desirable that the current or the voltage be detected by every U-phase resistor, V-phase resistor, and W-phase resistor in the resistor group. However, it is possible to be in a form where each of the only three current/voltage detection parts 20a is disposed at every U-phase, V-phase, and W-phase at a portion of the previous stage where the power supplied from the power source to be tested via the main switch 50 is distributed at every resistor group.

The present embodiment gives an example where a total of four resistor groups consisting of two resistor groups (a first resistor group G1, a second resistor group G2) with a rated capacity of 5 kW and two resistor groups (a third resistor group G3, a fourth resistor group G4) with a rated capacity of 10 kW are provided for a load test of the three-phase AC power source.

Each resistor group is provided with two resistors (a first resistor $R_1$, a second resistor $R_2$) connected in series for the U-phase that connects with an R-phase terminal of the power source to be tested, two resistors (a third resistor $R_2$, a fourth resistor $R_4$) connected in series for the V-phase that connects with an S-phase terminal of the power source to be tested, two resistors (a fifth resistor $R_5$, a sixth resistor $R_6$) connected in series for the W-phase that connects with a T-phase terminal of the power source to be tested, and a switching device (a relay) SW between the first resistor $R_1$ and second resistor $R_2$, between the third resistor $R_3$ and the fourth resistor $R_4$, and between the fifth resistor $R_5$ and the sixth resistor $R_6$.

The switching device SW is on/off controlled corresponding to on/off operation of the first switch S1 to the fourth switch S4, which will be described below, and causes the current to flow through the corresponding resistor in an on state.

Figure 3:
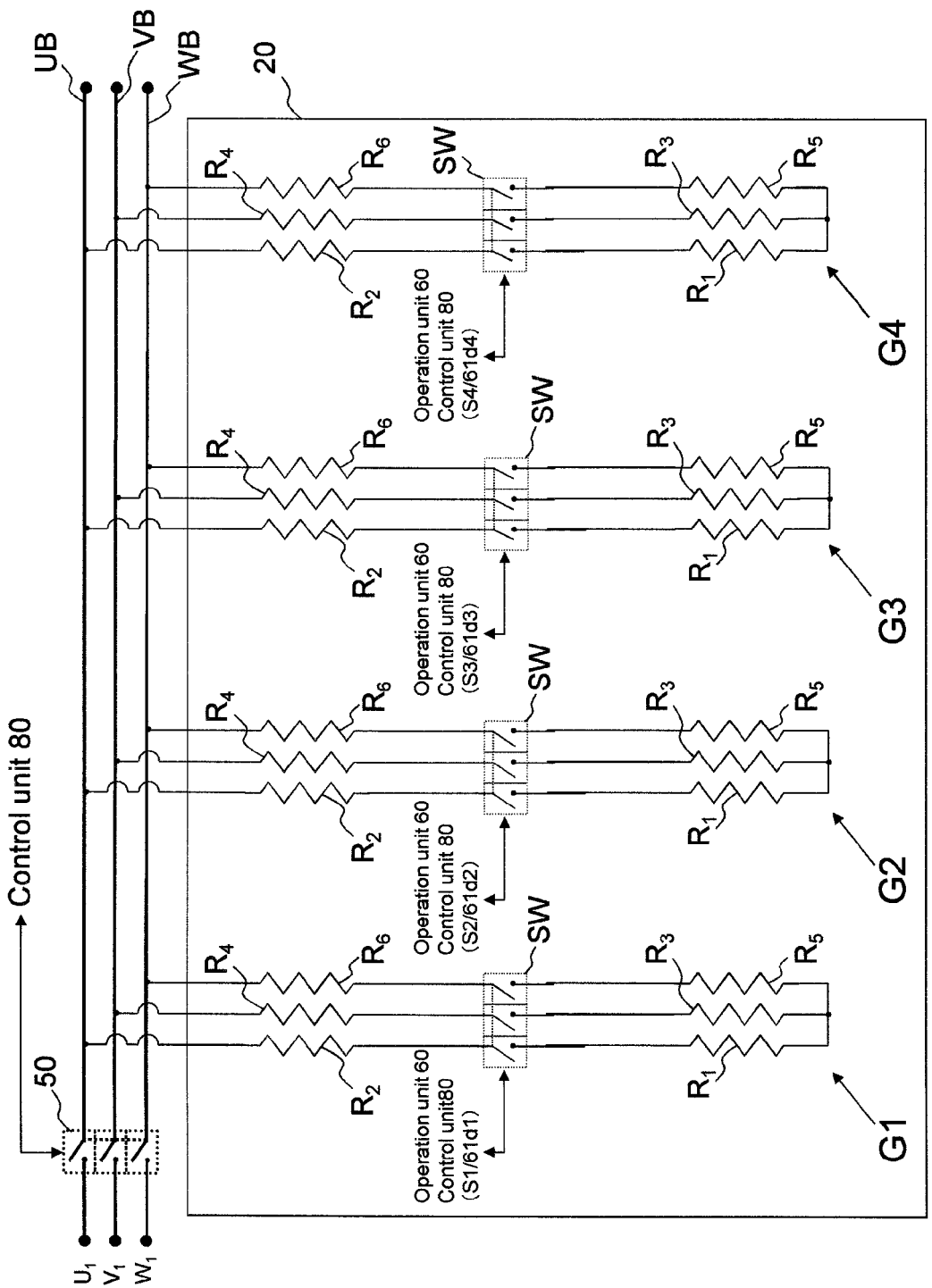
FIG. 3 is an exemplary diagram that illustrates a circuit configuration of a resistive unit.

As illustrated in FIG. 3, the switching device SW may be a triple-unit switch where a relay for the U-phase, a relay for the V-phase, and a relay for the W-phase on/off operate by linking with each other, or may be a single-unit switch where the respective relays on/off operate independently.

One terminal of the second resistor $R_2$ in each resistor group is connected with a line UB for the U-phase that extends from a U-phase terminal $U_1$ that connects with the R-phase terminal of the power source to be tested, one terminal of the fourth resistor $R_4$ therein is connected with a line VB for the V-phase that extends from a V-phase terminal $V_1$ that connects with the S-phase terminal of the power source to be tested, and one terminal of the sixth resistor $R_6$ therein is connected with a line WB for the W-phase that extends from a W-phase terminal $W_1$ that connects with the T-phase terminal of the power source to be tested.

One terminal of the first resistor $R_1$ in each resistor group, one terminal of the third resistor $R_3$ therein, and one terminal of the fifth resistor $R_5$ therein are short-circuited.

However, the number of the resistor groups, the rated voltages or the rated capacities thereof, the wiring of the resistors, and the switching devices SW are not limited to the aforementioned configuration.

In a case of detecting the current, a form where an ammeter for the U-phase is provided at a portion of the switching device SW in each resistor group that connects with the first resistor $R_1$, an ammeter for the V-phase is provided at a portion thereof that connects with the third resistor $R_3$, and an ammeter for the W-phase is provided at a portion thereof that connects with the fifth resistor $R_5$ is considered as an installation example of the current/voltage detection part 20a.

In a case of detecting the voltage, a form where a voltmeter whose ends are connected to one terminal of the first resistor $R_1$ and one terminal of the second resistor $R_2$ in each resistor group is provided, a voltmeter whose ends are connected to one terminal of the third resistor $R_3$ and one terminal of the fourth resistor $R_4$ therein is provided, and a voltmeter whose ends are connected to one terminal of the fifth resistor $R_5$ and one terminal of the sixth resistor $R_6$ therein is provided is considered as an installation example of the current/voltage detection part 20a.

However, the number of the resistor groups, the rated voltages or the rated capacities thereof, the wiring of the resistors, and the arrangements of the ammeters or the voltmeters are not limited to the aforementioned configuration.

Further, the current/voltage detection part 20a may be in a form of detecting at least one of the current and the voltage. However, in order to accurately detect an abnormality, it is desirable that the current/voltage detection part 20a be in a form of detecting both the current and the voltage.

The temperature detection part 20b detects the exhaust temperature of the upper part (downstream) of the resistive unit 20 and transmits information about the exhaust temperature to the control unit 80.

The housing 30 is a case that holds the load testing apparatus, such as the cooling fan 10, the resistive unit 20, the main switch 50, the operation unit 60, and the control unit 80. In the housing 30, an intake port 31 is provided on a lower side surface (upstream) of the cooling fan 10, and an exhaust port 33 is provided on an upper side (downstream) of the resistive unit 20.

An intake lid 32 that is opened when being used and closed when not being used is provided at the intake port 31, and an exhaust lid 34 that is opened when being used and closed when not being used is provided at the exhaust port 33.

The intake lid 32 is opened and closed via a first actuator 32a that operates by linking with on/off operation of the operation unit 60. The intake lid 32 is provided with an intake opening detection part 32b that is structured by a proximity sensor, a limit switch, or the like. The intake opening detection part 32b detects an opened/closed state of the intake lid 32, i.e., whether the intake port 31 is opened. It should be noted that the opening/closing is not limited to automatic opening/closing using the first actuator 32a and may be in a form of manually opening and closing the intake lid 32.

The intake opening detection part 32b detects whether or not the intake lid 32 is opened and transmits information about whether or not the intake lid 32 is opened to the control unit 80. However, the intake opening detection part 32b may have a form of detecting a degree of opening/closing of the intake lid 32 further minutely.

The exhaust lid 34 is opened and closed via a second actuator 34a that operates by linking with the on/off operation of the operation unit 60. The exhaust lid 34 is provided with an exhaust opening detection part 34b that is structured by a proximity sensor, a limit switch, or the like. The exhaust opening detection part 34b detects an opened/closed state of the exhaust lid 34, i.e., whether the exhaust port 33 is opened. It should be noted that the opening/closing is not limited to automatic opening/closing using the second actuator 34a and may be in a form of manually opening and closing the exhaust lid 34.

The exhaust opening detection part 34b detects whether or not the exhaust lid 34 is opened and transmits information about whether or not the exhaust lid 34 is opened to the control unit 80. However, the exhaust opening detection part 34b may have a form of detecting a degree of opening/closing of the exhaust lid 34 further minutely.

In the present embodiment, description is given of a form where any of the intake lid 32 and the exhaust lid 34 is configured by a hinged door via a hinge. However, the intake lid 32 or the exhaust lid 34 may be in a form of being configured by the other door structure, such as a sliding door.

The main switch 50 is constituted by a VCB (Vacuum Circuit Breaker) and the like, and is connected between the resistive unit 20 and the power source to be tested (provided on the line UB for the U-phase, on the line VB for the V-phase, and on the line WB for the W-phase). The power from the power source to be tested is supplied to the resistive unit 20 in an on state, and the power supply from the power source to be tested to the resistive unit 20 is stopped in an off state.

While the load testing apparatus 1 operates normally, the main switch 50 is in the on state. In a case where the control unit 80 determines that any of the members configuring the load testing apparatus 1 is not operated normally (in a case where an abnormality is detected) based on the information from the respective detection parts, the main switch 50 is turned off, i.e., off control that stops the power supply from the power source to be tested to the resistive unit 20 is performed.

The operation unit 60 is provided with an on/off operation switch 60a that turns on or off a power source of the load testing apparatus 1 and the selection switch 60b (the first switch S1 to the fourth switch S4) that adjusts a load amount (selects the resistor group where the power supply from the power source to be tested is performed).

When the on/off operation switch 60a is operated and the main power source of the load testing apparatus 1 is turned on, based on power supplied from a power source for driving the load testing apparatus (auxiliary power source), the first actuator 32a operates to open the intake lid 32, and the second actuator 34a operates to open the exhaust lid 34. The fan in the cooling fan 10 is rotated to feed air taken in from an opening part of the intake lid 32 to the resistive unit 20 disposed above. Further, based on the power supplied from the power source for driving the load testing apparatus (auxiliary power source), the control unit 80, the rotation state detection part 10a, the current/voltage detection part 20a, the temperature detection part 20b, the intake opening detection part 32b, and the exhaust opening detection part 34b operate.

It is possible to have a form where an on/off switch for the cooling fan 10 is provided separately from the on/off operation switch 60a, the on/off operation switch 60a is operated, and in a state in which the main power source of the load testing apparatus 1 is turned on, the on/off switch for the cooling fan 10 is operated to start rotation of the fan in the cooling fan 10.

After the main power source of the load testing apparatus 1 is turned on, the selection switch 60b (the first switch S1 to the fourth switch S4) is operated to enable energization to the resistive unit 20. In this state, the main switch 50 is turned on, the switching device SW of the resistor group corresponding to the selection switch 60b (the first switch S1 or the like) that has selected the energization is turned on, and the power is supplied from the power source to be tested connected via the main switch 50 to the resistor group that can be energized in the resistive unit 20.

For example, in a case where the first switch S1 and the second switch S2 are turned on and the third switch S3 and the fourth switch S4 are turned off, the switching devices SW of the first resistor group G1 and the second resistor group G2 with the rated capacity of 5 kW corresponding to the first switch S1 and the second switch S2 are turned on, and the power from the power source to be tested is supplied to the first resistor group G1 and the second resistor group G2. The switching devices SW of the third resistor group G3 and the fourth resistor group G4 with the rated capacity of 10 kW corresponding to the third switch S3 and the fourth switch S4 are turned off, and the power from the power source to be tested is not supplied to the third resistor group G3 and the fourth resistor group G4.

The operation unit 60 is provided with an intake lid warning part 61a, an exhaust lid warning part 61b, a cooling fan warning part 61c, a current/voltage warning part 61d, and a temperature warning part 61e. The intake lid warning part 61a, the exhaust lid warning part 61b, the cooling fan warning part 61c, the current/voltage warning part 61d, or the temperature warning part 61e performs an output for warning, according to a malfunction of a state of the member corresponding to the intake lid warning part 61a, the exhaust lid warning part 61b, the cooling fan warning part 61c, the current/voltage warning part 61d, or the temperature warning part 61e.

The intake lid warning part 61a is provided in a vicinity of an "Intake lid" column provided in the operation unit 60. In a case where the intake lid 32 is not sufficiently opened, the intake lid warning part 61a lights for warning to indicate by light that off control is based on the information from the intake opening detection part 32b.

The exhaust lid warning part 61b is provided in a vicinity of an "Exhaust lid" column provided in the operation unit 60. In a case where the exhaust lid 34 is not sufficiently opened, the exhaust lid warning part 61b lights for warning to indicate by light that off control is based on the information from the exhaust opening detection part 34b.

The cooling fan warning part 61c is provided in a vicinity of a "Cooling fan" column provided in the operation unit 60. In a case where the cooling fan 10 does not operate normally, the cooling fan warning part 61c lights for warning to indicate by light that off control is based on the information from the rotation state detection part 10a.

The first warning part 61d1 to the fourth warning part 61d4 included in the current/voltage warning part 61d are respectively provided in vicinities of the first switch S1 to the fourth switch S4. In a case where values of currents flowing through the first resistor group G1 to the fourth resistor group G4 corresponding to the first switch S1 to the fourth switch S4 or values of a voltages applied to the resistor groups are not normal, any of the first warning part 61d1 to the fourth warning part 61d4 lights for warning to indicate by light that off control is based on the information from the current/voltage detection part 20a.

For example, in a case where the value of the current flowing through the first resistor group G1 corresponding to the first switch S1 is not normal, the first warning part 61d1, of the current/voltage warning part 61d, provided in the vicinity of the first switch S1 lights for warning to indicate by light that off control is based on the information from the current/voltage detection part 20a provided in the first resistor group G1.

The temperature warning part 61e is provided in a vicinity of an "Exhaust temperature" column provided in the operation unit 60. In a case where the exhaust temperature is high and the resistor is not cooled normally, the temperature warning part 61e lights for warning to indicate by light that off control is based on the information from the temperature detection part 20b.

Besides lighting for warning (e.g., lit in red), any of the intake lid warning part 61a, the exhaust lid warning part 61b, the cooling fan warning part 61c, the current/voltage warning part 61d, and the temperature warning part 61e may be in a form of lighting in a different color (e.g., lit in green) during the normal operation.

The control unit 80 is a device that controls the respective units of the load testing apparatus 1, such as the switching device SW, the cooling fan 10, and the main switch 50. Particularly, after detecting an operating condition of the cooling fan 10 by the rotation state detection part 10a, an operating condition of the resistive unit 20 (a condition of the current flowing through or the voltage applied to the resistor group) by the current/voltage detection part 20a, an opened state of the opening part (the intake port 31 or the exhaust port 33) in the housing 30 by the intake opening detection part 32b or the exhaust opening detection part 34b, and the exhaust temperature at the downstream of the resistive unit 20 by the temperature detection part 20b, the control unit 80 performs off control (off control of the power supply from the power source to be tested to the resistive unit 20) of the main switch 50. In other words, the control unit 80 performs the off control based on the information from the intake opening detection part 32b, the information from the exhaust opening detection part 34b, the information from the rotation state detection part 10a (the information about the rotation state of the cooling fan 10), the information from the current/voltage detection part 20a (the information about the current flowing through the resistor and the like or the voltage applied to the resistor and the like), and the information from the temperature detection part 20b (the information about the exhaust temperature at the downstream of the resistor).

Figure 4:
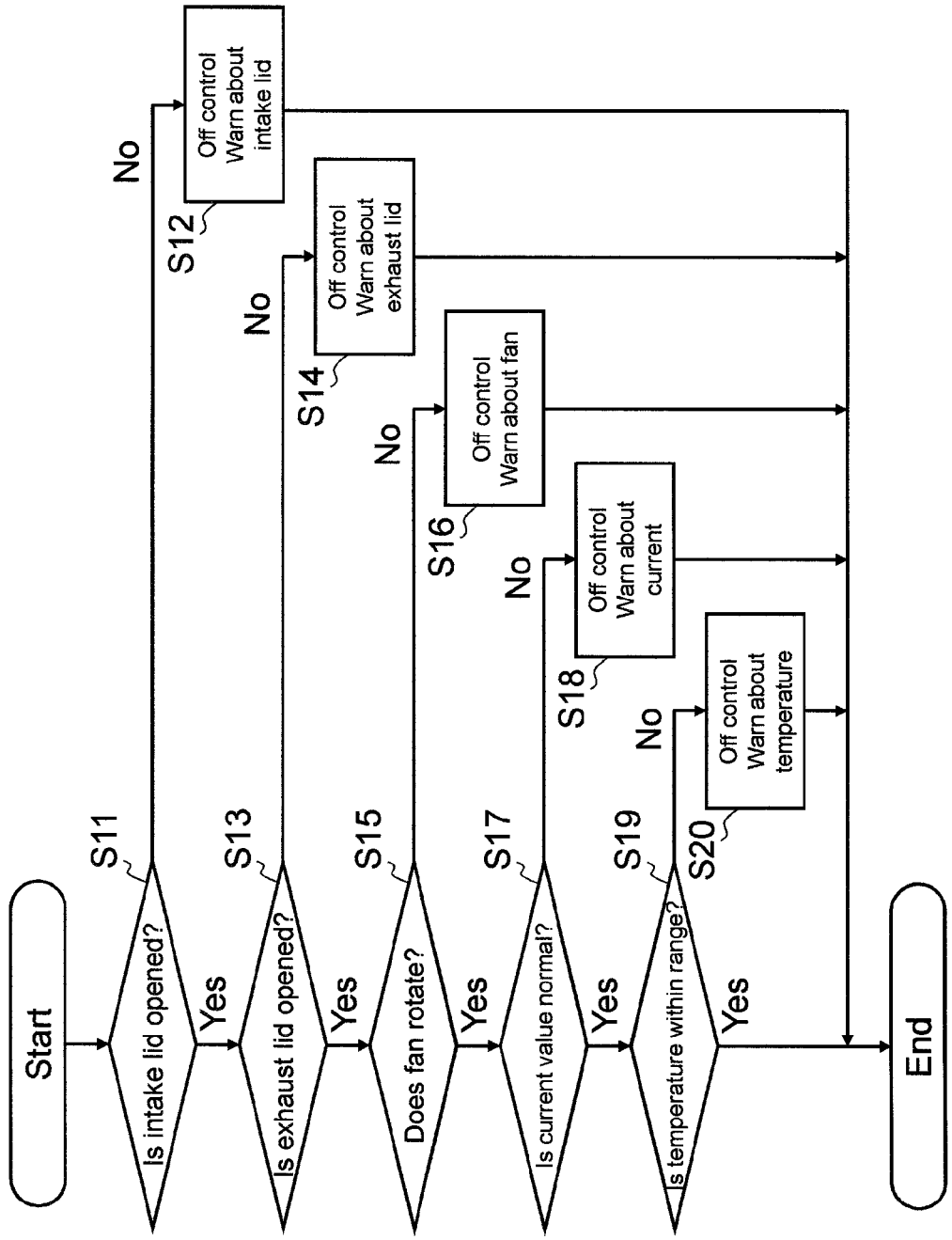
FIG. 4 is a flowchart that illustrates an operation procedure of off control.

A procedure of the off control by the control unit 80 will be described by using a flowchart in FIG. 4. The control in step S11 to step S20 is performed for a fixed time (e.g., every one minute) after the main power source of the load testing apparatus 1 is turned on until the off control is performed. It is desirable that the procedure in step S11 or the like be started not immediately after the main power source of the load testing apparatus 1 is turned on but after a time needed to open the intake lid 32 or the exhaust lid 34 by the first actuator 32a or the second actuator 34a has passed.

Based on the information from the intake opening detection part 32b about the opened/closed state of the intake lid 32, the control unit 80 determines whether or not the intake lid 32 is sufficiently opened (see step S11). If it is determined that the intake lid 32 is not opened, the control unit 80 turns off the main switch 50 and stops the power supply from the power source to be tested to the resistive unit 20 of the load testing apparatus 1. Further, the control unit 80 warns "The intake port 31 is not opened normally" (see step S12).

Figure 5:
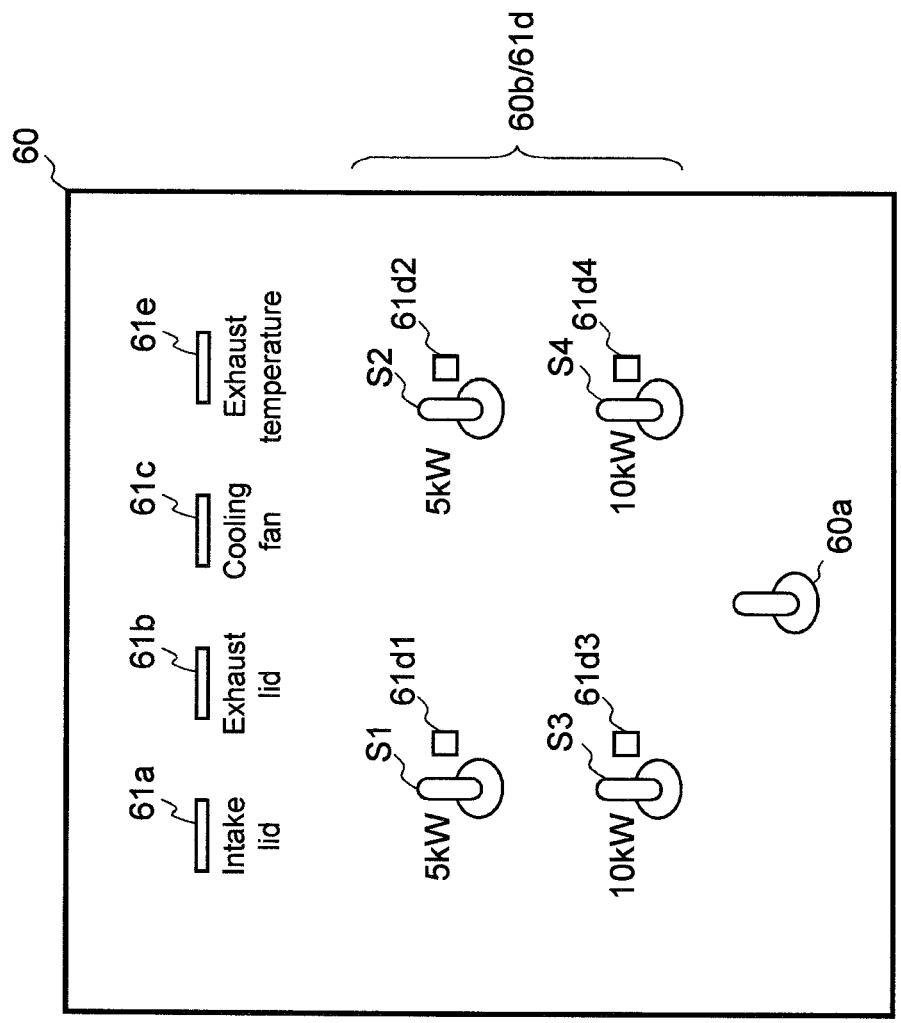
FIG. 5 is an exemplary diagram that illustrates a configuration of an operation unit.

As an example of the warning, a form of lighting the intake lid warning part 61a provided in the vicinity of the "Intake lid" column in the operation unit 60 is considered (see FIG. 5).

Figure 6:
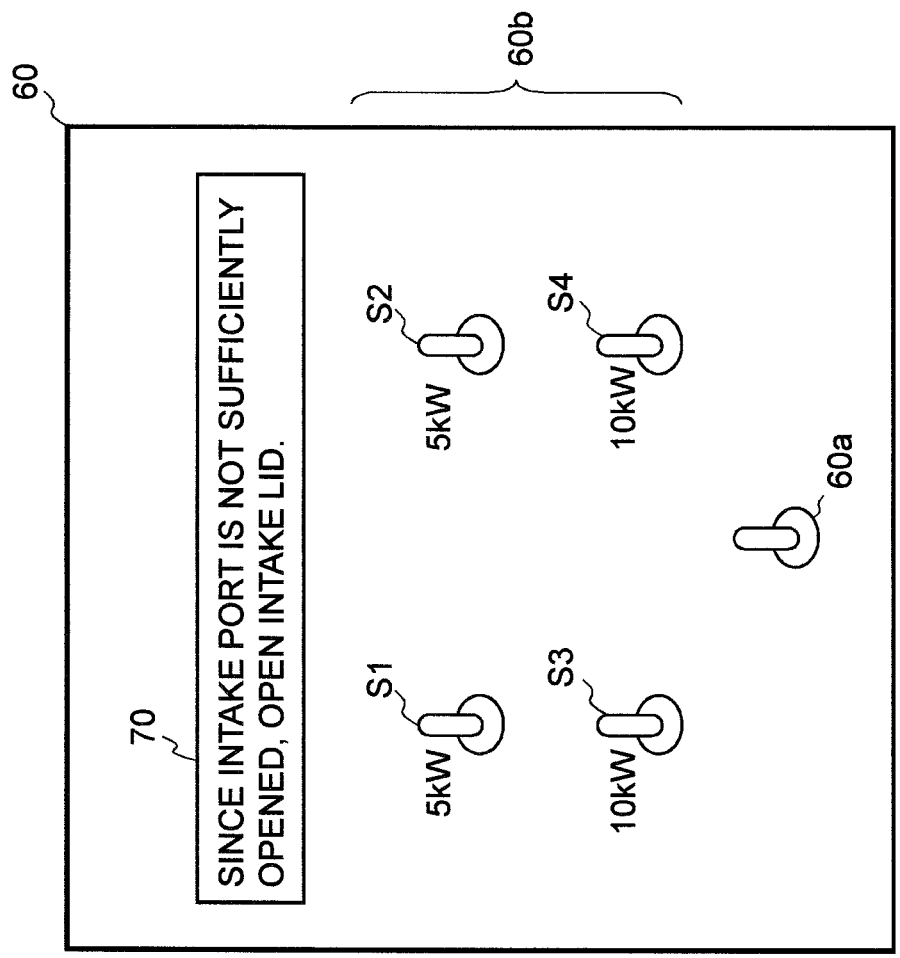
FIG. 6 is an exemplary diagram that illustrates a configuration of the operation unit in a form where a display device is provided in the operation unit.

Further, it is possible to consider a form where a display device 70 capable of displaying characters is provided in the operation unit 60 or the like and displays a message saying "SINCE INTAKE PORT IS NOT SUFFICIENTLY OPENED, OPEN INTAKE LID" (see FIG. 6).

Based on the information from the exhaust opening detection part 34b about the opened/closed state of the exhaust lid 34, the control unit 80 determines whether or not the exhaust lid 34 is sufficiently opened (see step S13). If it is determined that the exhaust lid 34 is not opened, the control unit 80 turns off the main switch 50 and stops the power supply from the power source to be tested to the resistive unit 20 of the load testing apparatus 1. Further, the control unit 80 warns "The exhaust port 33 is not opened normally" (see step S14).

As an example of the warning, a form of lighting the exhaust lid warning part 61b provided in the vicinity of the "Exhaust lid" column in the operation unit 60 is considered.

Further, it is possible to consider a form where the display device 70 capable of displaying characters is provided in the operation unit 60 or the like and displays a message saying "SINCE EXHAUST PORT IS NOT SUFFICIENTLY OPENED, OPEN EXHAUST LID".

Based on the information from the rotation state detection part 10a about the rotation number of the cooling fan 10, the control unit 80 determines whether or not the cooling fan 10 operates sufficiently (e.g., whether or not the cooling fan 10 rotates at the rotation number of a threshold value or more) (see step S15). If it is determined that the cooling fan 10 does not operate, the control unit 80 turns off the main switch 50 and stops the power supply from the power source to be tested to the resistive unit 20 of the load testing apparatus 1. Further, the control unit 80 warns "The cooling fan 10 does not operate normally" (see step S16).

As an example of the warning, a form of lighting the cooling fan warning part 61c provided in the vicinity of the "Cooling fan" column in the operation unit 60 is considered.

Further, it is possible to consider a form where the display device 70 capable of displaying characters is provided in the operation unit 60 or the like and displays a message saying "SINCE COOLING FAN DOES NOT OPERATE SUFFICIENTLY, CHECK COOLING FAN".

For each resistor group where the power is supplied from the power source to be tested, based on the information from the current/voltage detection part 20a about the current flowing through the resistor group or the voltage applied to the resistor group, the control unit 80 determines whether or not the current flowing through the resistor group or the voltage applied to the resistor group is within a range during normal operation (see step S17). If it is determined that the current flowing through the resistor group or the voltage applied thereto is outside the range during normal operation, the control unit 80 turns off the main switch 50 and stops the power supply from the power source to be tested to the resistive unit 20 of the load testing apparatus 1. Further, the control unit 80 warns "The value of the current flowing through the resistor group or the value of the voltage applied to the resistor group is not normal" (see step S18).

The determination in step S17 may have a form where the current detection or the voltage detection is performed only on the resistor group which has been selected as a power supply object by the operation of the selection switch 60b (the first switch S1 to the fourth switch S4). However, due to a malfunction of the switching device SW or the like, there is also a possibility that the power supply from the power source to be tested is performed on the resistor group, to which the power should not be originally supplied. Accordingly, the determination in step S17 may have a form where the current detection or the voltage detection is performed (whether or not the current flows or whether or not the voltage is applied is confirmed) also on the resistor group which has not been selected as the power supply object by the operation of the selection switch 60b (the first switch S1 to the fourth switch S4).

In this case, for the resistor group which has been selected as the power supply object, a determination is made as to whether or not the value of the current flowing through the resistor group or the value of the voltage applied to the resistor group is within the range during normal operation. For the resistor group which has not been selected as the power supply object, a determination is made as to whether or not the current flows through the resistor group or whether or not the voltage is applied to the resistor group.

As an example of the warning, a form of lighting the current/voltage warning part 61d corresponding to the resistor group, at which a malfunction has occurred, of the current/voltage warning parts 61d (the first warning part 61d1 to the fourth warning part 61d4) provided in the vicinities of the first switch S1 to the fourth switch S4 in the operation unit 60 is considered.

Further, it is possible to consider a form where the display device 70 capable of displaying characters is provided in the operation unit 60 or the like and, for example, displays a message saying "SINCE VALUE OF CURRENT FLOWING THROUGH FIRST RESISTOR GROUP CORRESPONDING TO FIRST SWITCH OR VALUE OF VOLTAGE APPLIED TO THE RESISTOR GROUP IS NOT NORMAL, CHECK FIRST RESISTOR GROUP".

Based on the information from the temperature detection part 20b about the exhaust temperature, the control unit 80 determines whether or not the exhaust temperature exceeds a temperature threshold value (see step S19). If it is determined that the exhaust temperature exceeds the temperature threshold value, the control unit 80 turns off the main switch 50 and stops the power supply from the power source to be tested to the resistive unit 20 of the load testing apparatus 1. Further, the control unit 80 warns "The resistor is not cooled normally" (see step S20).

As an example of the warning, a form of lighting the temperature warning part 61e provided in the vicinity of the "Exhaust temperature" column in the operation unit 60 is considered.

Further, it is possible to consider a form where the display device 70 capable of displaying characters is provided in the operation unit 60 or the like and displays a message saying "SINCE RESISTOR IS NOT COOLED NORMALLY, CHECK EACH UNIT".

When the load testing apparatus 1 operates normally, intake of the cooling fan 10 is performed from the opening part (the intake port 31) where the intake lid 32 is opened, the air fed from the cooling fan 10 passes through the resistive unit 20 and is discharged from the opening part (the exhaust port 33) where the exhaust lid 34 is opened.

The power from the power source to be tested is supplied, and the energized resistors of the resistor group generate heat.

When the intake and the exhaust are performed normally, the cooling fan 10 operates normally, and the current flowing through or the voltage applied to the resistor is within the normal range, the resistor is cooled by the air fed from the cooling fan 10, the hot air is discharged from the exhaust port 33, and the load test can be performed safely.

In a case where the intake lid 32 is not opened normally, since the intake is not sufficiently performed, it is difficult for the cooling fan 10 to sufficiently feed the air into the resistor.

In a case where the exhaust lid 34 is not opened normally, since the exhaust is not sufficiently performed, it is difficult for the air from the cooling fan 10 to flow to the resistor.

In a case where the cooling fan 10 does not operate normally (does not rotate normally), since a predetermined amount of air cannot be fed into the resistive unit 20, the resistor is difficult to be cooled.

In a case where the resistor is damaged or dust is adhered thereto, the current flowing through the resistor increases (or the voltage applied to the resistor becomes high) by a short circuit or the like. Even when the cooling fan 10 operates normally, the resistor is difficult to be cooled.

Further, even in a case when the respective devices operate normally, there is a case where a cooling capacity is low and a temperature of the cooled object is high, e.g., the cooling fan 10 is within the range of normal operation but the rotation number thereof is low (close to a lower limit value within the range of normal operation), or the current flowing through the resistor is also within the range of normal operation but the current value is high (close to an upper limit value within the range of normal operation). In this case, it is considered that the resistor is difficult to be cooled. Further, in a case where a foreign matter is mixed in the resistive unit 20 or the like, the cooling fan 10 operates normally, and the current within the normal range flows to the resistor group, it can be difficult to cool the resistor as well.

In the present embodiment, the control unit 80 performs the off control of the main switch 50 after detecting the operating condition of the cooling fan 10 by the rotation state detection part 10a, the condition of the current or the voltage of the energized resistor group by the current/voltage detection part 20a, the opened state of the opening part (the intake port 31 or the exhaust port 33) in the housing 30 by the intake opening detection part 32b or the exhaust opening detection part 34b, and the exhaust temperature at the downstream of the resistive unit 20 (in the vicinity of the exhaust port 33) by the temperature detection part 20b. Accordingly, in a case where a malfunction has occurred in the load testing apparatus 1, the control unit 80 stops the power supply from the power source to be tested to the load testing apparatus 1 (the resistive unit 20). As a result, abnormality detection inside the load testing apparatus 1 is appropriately performed, and a further failure of the load testing apparatus 1 (particularly, the resistive unit 20) can be prevented.

Since an abnormality is detected by using the plurality of sensors, even in a case where any one sensor has the abnormality, the abnormality can be detected by the other sensors. For example, even when the rotation state detection part 10a has a malfunction and cannot detect an abnormality of the rotation state of the cooling fan 10, since the temperature detection part 20b can detect that the exhaust temperature is higher than a normal value, the abnormality can be found as a whole.

Therefore, the control unit 80 may be in a form of performing the off control that stops power supply from the power source to be tested to the resistive unit 20 based on the information from the exhaust opening detection part 34b and at least one of the information about the current flowing through or the voltage applied to the resistors, the resistor groups, or the resistive unit 20, the information about the exhaust temperature at the downstream of the resistive unit 20, and the information about the rotation state of the cooling fan 10.

Further, by performing the warning using the intake lid warning part 61a or the like to indicate the malfunctioning place, it is possible to visually recognize whether it is a problem of opening of the lid, an operation failure of the cooling fan 10, a malfunction of the resistive unit 20 (and which resistor group has a malfunction), the other malfunction (or an overall malfunction), or the like. There is also a merit that the malfunction can be easily improved.

Figure 7:
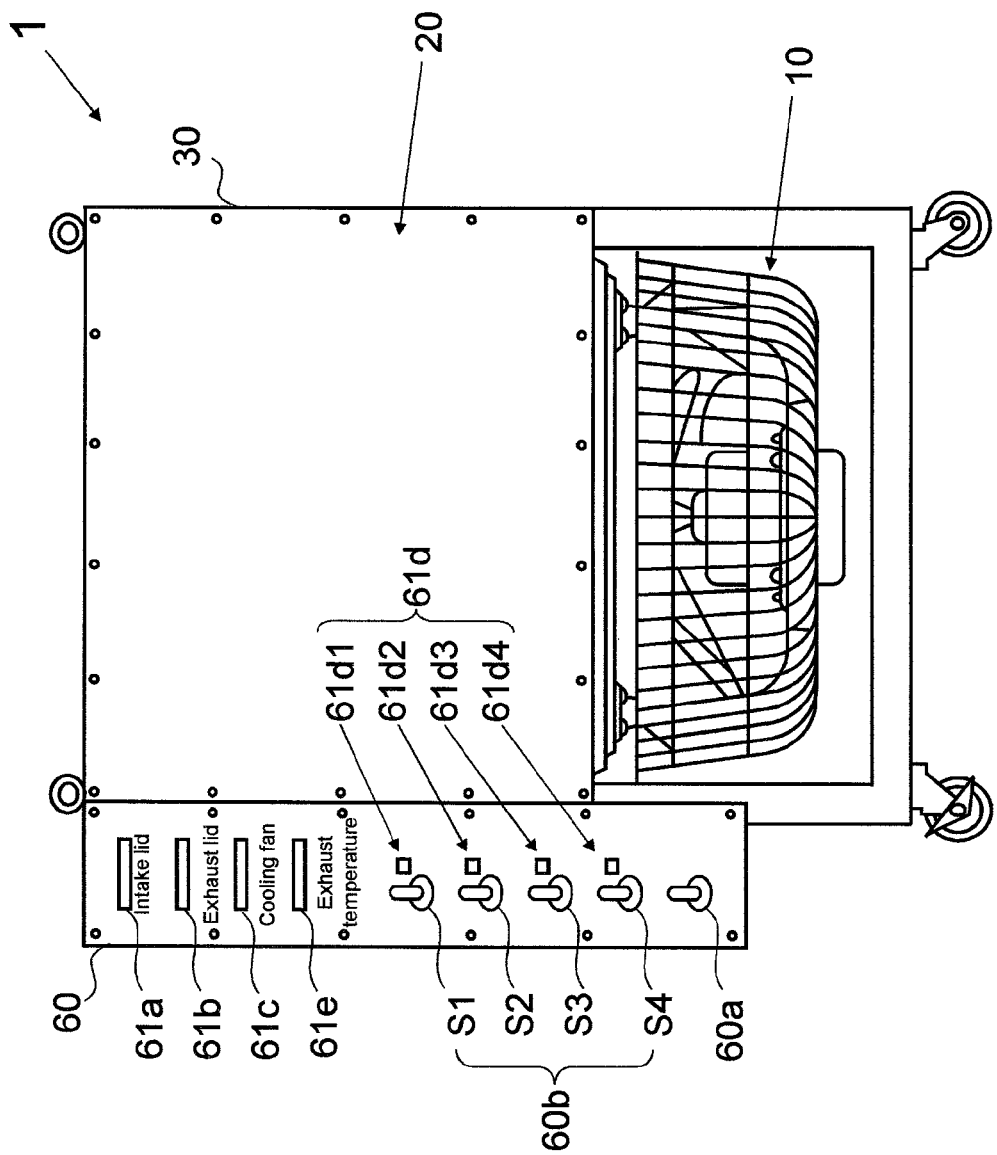
FIG. 7 is a side view of a load testing apparatus for a low voltage using the off control in the present embodiment.
Figure 8:
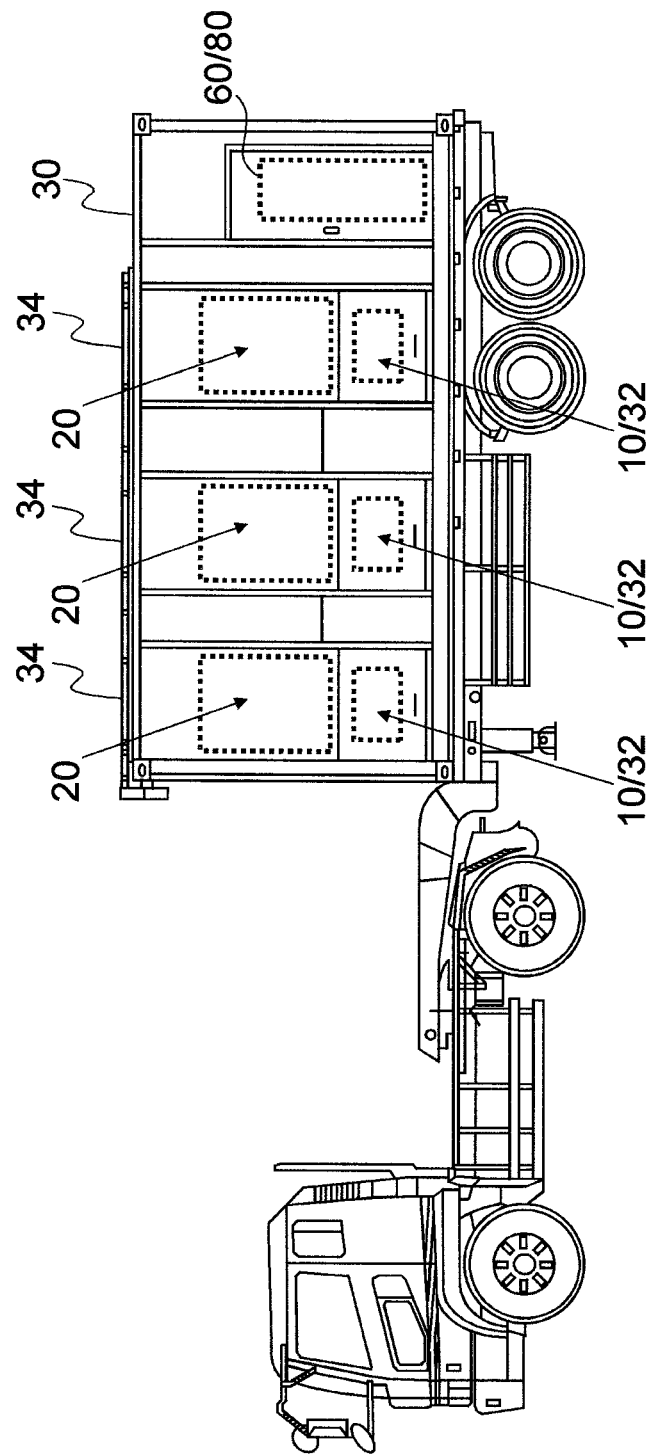
FIG. 8 is a side view of a load testing apparatus for a high voltage using the off control in the present embodiment.
Figure 9:
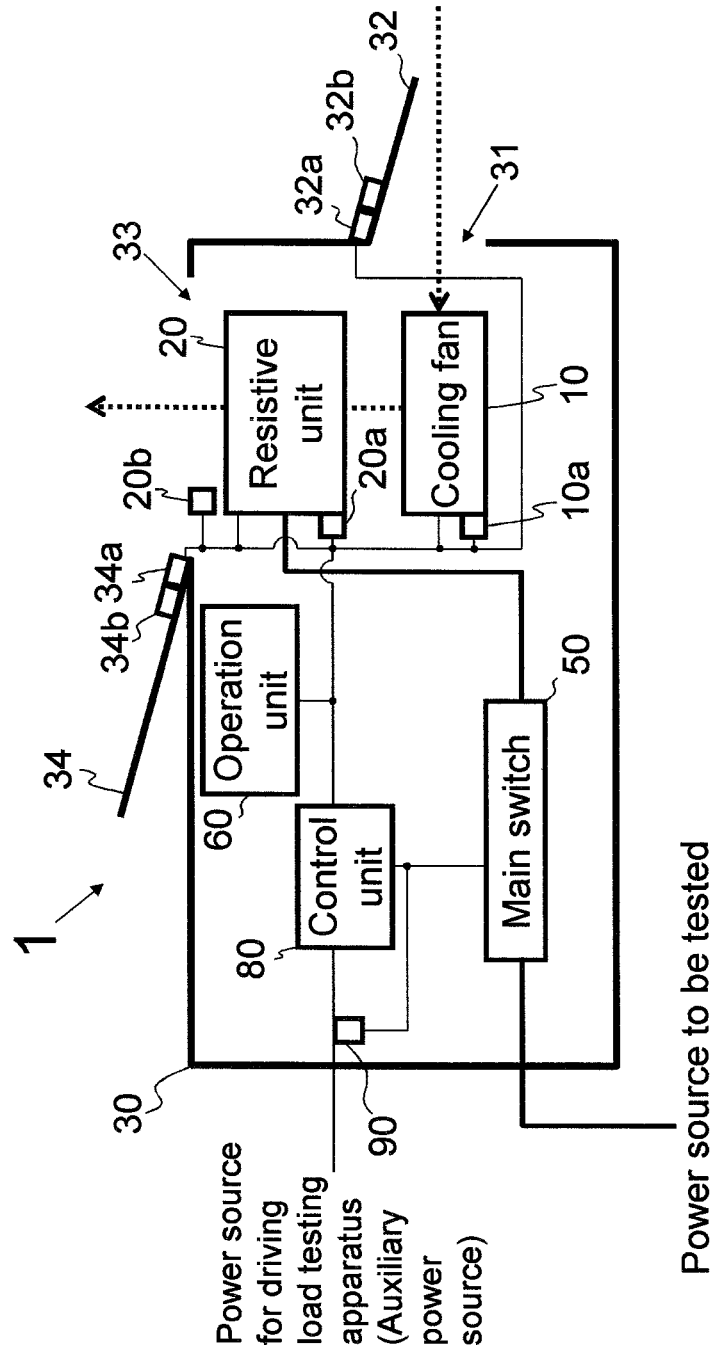
FIG. 9 is an exemplary diagram that illustrates a configuration of a load testing apparatus provided with a protective relay.

It should be noted that the load testing apparatus 1 in the present embodiment can be also applied to a load testing apparatus for a low voltage corresponding to a low voltage power source as illustrated in FIG. 7 and can be also applied to a load testing apparatus for a high voltage corresponding to a high voltage power source as illustrated in FIG. 8.

However, there is also a load testing apparatus in which an intake lid 32 and an exhaust lid 34 are omitted and an intake port 31 and an exhaust port 33 are always opened. In this case, an intake opening detection part 32b and an exhaust opening detection part 34b are omitted (see FIG. 7).

Further, in order to make a user visually recognize the warning, the warning may be in a form of an output using light, may be in a form of a sound output, or may be in a warning form using both.

Further, a malfunction of the auxiliary power source (the power source for driving the load testing apparatus) that supplies power to drive the cooling fan 10 or the control unit 80 and that of a cable connecting the auxiliary power source and the load testing apparatus 1 are checked. If it is determined that there is a malfunction, the off control may be performed.

In this case, a protective relay 90 is provided on a power source line (particularly, on the power source line to the cooling fan 10) for supplying power from the auxiliary power source to the respective units (the cooling fan 10, the rotation state detection part 10a, the current/voltage detection part 20a, the temperature detection part 20b, the first actuator 32a, the intake opening detection part 32b, the second actuator 34a, the exhaust opening detection part 34b, and the control unit 80) of the load testing apparatus 1.

The protective relay 90 detects the voltage applied to the load testing apparatus 1 (the cooling fan 10 and the like) via the power source line or the current flowing through the power source line.

In a case where the detected value of the voltage or value of the current is outside the predetermined range, the protective relay 90 turns off the main switch 50 via the control unit 80 (or directly without via the control unit 80). In other words, the protective relay 90 performs the off control that stops power supply from the power source to be tested to the resistive unit 20.

At this time, it is desirable that an abnormality in the power supply from the power source for driving be informed by light or sound by using the display device 70 or the warning parts.

In order to indicate the abnormality in the power supply from the power source for driving, the warning may be in a form of displaying characters on the display device 70 or in a form of providing a warning part separately from the intake lid warning part 61a and the like.

Alternatively, the warning may be in a form of lighting all of the intake lid warning part 61a, the exhaust lid warning part 61b, the cooling fan warning part 61c, the current/voltage warning part 61d, and the temperature warning part 61e to inform the abnormality.

If there is a malfunction in the auxiliary power source, it is possible that the sufficient power supply to the respective units of the load testing apparatus 1 cannot be performed, or it is also possible that the power supply thereto becomes excessive.

Further, in a case where a cable with a predetermined standard is not used for the cable between the auxiliary power source and the load testing apparatus 1, or in a case where there is a malfunction in the cable as well, it is possible that the sufficient power supply to the respective units of the load testing apparatus 1 cannot be performed, or it is also possible that the power supply thereto becomes excessive.

In such cases, it is possible that the respective units of the load testing apparatus 1 do not operate correctly, for example, the cooling fan 10 does not rotate sufficiently, the sensors, such as the rotation state detection part 10a, do not operate correctly, or the control unit 80 does not operate correctly. The load test cannot be performed normally.

In the present embodiment, abnormality detection of the power supply source (the auxiliary power source or the cable) is performed based on the power supply state from the auxiliary power source serving as a source of driving the respective units of the load testing apparatus 1. In a case where the power supply from the auxiliary power source is performed normally, the power supply from the power source to be tested is enabled. Accordingly, it is possible to perform the abnormality detection or the load test of the load testing apparatus 1 correctly.

REFERENCE SIGNS LIST 1 load testing apparatus
10 cooling fan
10a rotation state detection part
20 resistive unit
20a current/voltage detection part
20b temperature detection part
30 housing
31 intake port
32 intake lid
32a first actuator
32b intake opening detection part
33 exhaust port
34 exhaust lid
34a second actuator
34b exhaust opening detection part
50 main switch
60 operation unit
60a on/off operation switch
60b selection switch
61a intake lid warning part
61b exhaust lid warning part
61c cooling fan warning part
61d current/voltage warning part
61d1 to 61d4 first warning part to fourth warning part
61e temperature warning part
70 display device
80 control unit
90 protective relay
G1 to G4 first resistor group to fourth resistor group
$R_1$ to $R_6$ first resistor to sixth resistor
S1 to S4 first switch to fourth switch
SW switching device
$U_1$ U-phase terminal
UB line for U-phase
$V_1$ V-phase terminal
VB line for V-phase
$W_1$ W-phase terminal
WB line for W-phase

The invention claimed is:
1. A load testing apparatus, comprising:
a resistive unit that includes one or more resistor groups having a plurality of resistors and is connected with a power source to be tested for a load test;
a cooling fan that cools the resistors in the resistive unit; and
a control unit,
wherein
the resistive unit is provided with a current/voltage detection part that detects a current flowing through or a voltage applied to the resistors, the resistor groups, or the resistive unit and a temperature detection part that detects an exhaust temperature at a downstream of the resistive unit,
a rotation state detection part that detects a rotation state of the cooling fan is provided in the cooling fan, and
the control unit performs off control that stops power supply from the power source to be tested to the resistive unit based on information from the current/voltage detection part, information from the temperature detection part, and information from the rotation state detection part; and
wherein
an exhaust lid that opens when being used is provided at an exhaust port at the downstream of the resistive unit,
an exhaust opening detection part that detects an opened/closed state of the exhaust lid is provided at the exhaust port or the exhaust lid, and
the control unit performs the off control based on the information from the current/voltage detection part, the information from the temperature detection part, the information from the rotation state detection part, and information from the exhaust opening detection part.

2. The load testing apparatus according to claim 1, wherein
an intake lid that opens when being used is provided at an intake port of the cooling fan,
an intake opening detection part that detects an opened/closed state of the intake lid is provided at the intake port or the intake lid,
the control unit performs the off control based on the information from the current/voltage detection part, the information from the temperature detection part, the information from the rotation state detection part, the information from the exhaust opening detection part, and information from the intake opening detection part.

3. The load testing apparatus according to claim 1, wherein
an opening operation of the exhaust lid is performed by driving an actuator,
the off control is started after a time needed to open the exhaust lid by the actuator has passed since a main power source of the load testing apparatus is turned on.

4. A load testing apparatus comprising:
a resistive unit that includes one or more resistor groups having a plurality of resistors and is connected with a power source to be tested for a load test;
a cooling fan that cools the resistors in the resistive unit; and
a control unit, wherein
an exhaust lid that opens when being used is provided at an exhaust port at a downstream of the resistive unit,
an exhaust opening detection part that detects an opened/closed state of the exhaust lid is provided at the exhaust port or the exhaust lid, and
the control unit performs off control that stops power supply from the power source to be tested to the resistive unit based on information from the exhaust opening detection part and at least one of information about a current flowing through or a voltage applied to the resistors, the resistor groups, or the resistive unit, information about an exhaust temperature at the downstream of the resistive unit, and information about a rotation state of the cooling fan.

5. The load testing apparatus according to claim 4, further comprising a protective relay that performs the off control based on information about a current flowing through a power source line from a power source for driving that supplies power driving the cooling fan or a voltage applied from the power source for driving to the load testing apparatus via the power source line.

* * * * *